(12) United States Patent
Thomsen et al.

(10) Patent No.: US 8,802,216 B2
(45) Date of Patent: Aug. 12, 2014

(54) SOLAR CELL USING LOW IRON HIGH TRANSMISSION GLASS WITH ANTIMONY AND CORRESPONDING METHOD

(75) Inventors: Scott V. Thomsen, South Lyon, MI (US); Ksenia A. Landa, Grosse Ile, MI (US); Leonid Landa, Grosse Ile, MI (US); Richard Hulme, Rochester Hills, MI (US); Anna Broughton, New Boston, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1104 days.

(21) Appl. No.: 12/659,217

(22) Filed: Mar. 1, 2010

(65) Prior Publication Data

US 2010/0154477 A1 Jun. 24, 2010

Related U.S. Application Data

(62) Division of application No. 11/122,218, filed on May 5, 2005, now Pat. No. 7,700,870.

(51) Int. Cl.
| | |
|---|---|
| *C03C 3/083* | (2006.01) |
| *C03B 8/02* | (2006.01) |
| *H01L 31/0392* | (2006.01) |
| *C03C 4/02* | (2006.01) |
| *H01L 31/0236* | (2006.01) |
| *C03C 19/00* | (2006.01) |
| *C03B 13/08* | (2006.01) |
| *C03C 3/087* | (2006.01) |

(52) U.S. Cl.
CPC ............ *C03C 3/087* (2013.01); *H01L 31/0392* (2013.01); *C03C 4/02* (2013.01); *H01L 31/0236* (2013.01); *C03C 2204/08* (2013.01); *C03C 19/00* (2013.01); *C03B 13/08* (2013.01); *Y02E 10/50* (2013.01)
USPC ............................ 428/156; 501/68; 65/29.16

(58) Field of Classification Search
USPC .............. 428/156; 65/93, 95, 97, 101; 501/68
See application file for complete search history.

(56) References Cited

U.S. PATENT DOCUMENTS

| 3,753,674 | A | 8/1973 | Ohlberg et al. |
| 4,298,389 | A | 11/1981 | Johnson et al. |
| 4,510,344 | A | 4/1985 | Berman |

(Continued)

FOREIGN PATENT DOCUMENTS

| EP | 1 116 699 | 7/2001 |
| EP | 1 118 597 | 7/2001 |

(Continued)

OTHER PUBLICATIONS

U.S. Appl. No. 11/122,218, filed May 5, 2005; Thomsen et al.

(Continued)

*Primary Examiner* — Jayne Mershon
(74) *Attorney, Agent, or Firm* — Nixon & Vanderhye P.C.

(57) ABSTRACT

A high transmission and low iron glass is provided for use in a solar cell. The glass substrate may be patterned on at least one surface thereof. Antimony (Sb) is used in the glass to improve stability of the solar performance of the glass upon exposure to ultraviolet (UV) radiation and/or sunlight. The combination of low iron content, antimony, and/or the patterning of the glass substrate results in a substrate with high visible transmission and excellent light refracting characteristics.

4 Claims, 1 Drawing Sheet

(56) References Cited

U.S. PATENT DOCUMENTS

| | | | |
|---|---|---|---|
| 4,792,536 A | 12/1988 | Pecoraro et al. | |
| 4,806,436 A | 2/1989 | Tada et al. | |
| 5,214,008 A | 5/1993 | Beckwith et al. | |
| 5,401,287 A | 3/1995 | Pecoraro et al. | |
| 5,674,791 A | 10/1997 | Amundson, Jr. | |
| 5,883,030 A | 3/1999 | Bako et al. | |
| 5,964,962 A | 10/1999 | Sannomiya et al. | |
| 5,977,477 A | 11/1999 | Shiozaki | |
| 6,372,327 B1 | 4/2002 | Burnham et al. | |
| 6,403,509 B2 | 6/2002 | Cochran et al. | |
| 6,407,021 B1 | 6/2002 | Kitayama et al. | |
| 6,495,482 B1 | 12/2002 | de Sandro et al. | |
| 6,498,118 B1 | 12/2002 | Landa et al. | |
| 6,503,860 B1 | 1/2003 | Dickinson et al. | |
| 6,506,622 B1 | 1/2003 | Shiozaki | |
| 6,521,558 B2 | 2/2003 | Thomsen et al. | |
| 6,573,207 B2 | 6/2003 | Landa et al. | |
| 6,610,622 B1 | 8/2003 | Landa et al. | |
| 6,716,780 B2 | 4/2004 | Landa et al. | |
| 6,776,007 B2 | 8/2004 | Hirota et al. | |
| 6,796,146 B2 | 9/2004 | Burnham | |
| 6,846,760 B2 | 1/2005 | Siebers et al. | |
| 7,557,053 B2 | 7/2009 | Thomsen et al. | |
| 7,700,870 B2 | 4/2010 | Thomsen et al. | |
| 2002/0102388 A1 | 8/2002 | Burnham | |
| 2003/0180476 A1 | 9/2003 | Yamashita et al. | |
| 2003/0216241 A1* | 11/2003 | Landa et al. | 501/64 |
| 2004/0038051 A1 | 2/2004 | Fujisawa et al. | |
| 2004/0121896 A1 | 6/2004 | Landa et al. | |
| 2004/0209757 A1 | 10/2004 | Landa et al. | |

FOREIGN PATENT DOCUMENTS

| | | |
|---|---|---|
| JP | 01-239037 | 9/1989 |
| JP | 07-122764 | 5/1995 |
| JP | 08-026767 | 1/1996 |
| JP | 11-60269 | 3/1999 |
| JP | 11-298030 | 10/1999 |
| WO | WO 95/13993 | 5/1995 |

OTHER PUBLICATIONS

XP-002398521 "Glass Made Cover Solar Battery Rough Light Incidence Surface Flat Upper Portion Predetermined Surface Rough" (1pg), WPI/Derwent.

"Colored Glasses" Weyl; The Society of Glass Technology 1951, (4pgs).

"Colour Generation and Control in Glass", Bamford, Glass Science and Technology , 2, 1977 (3pgs).

"Photovoltaic Module Performance and Durability Following Long-Term Field Exposure", King et al., Sandia National Laboratories, (19pgs).

U.S. Appl. No. 11/373,490, filed Mar. 13, 2006; Thomsen et al.

U.S. Appl. No. 11/049,292, filed Feb. 3, 2005; Thomsen et al.

Machine Translation of JP-11-298030 Oct. 1999.

* cited by examiner

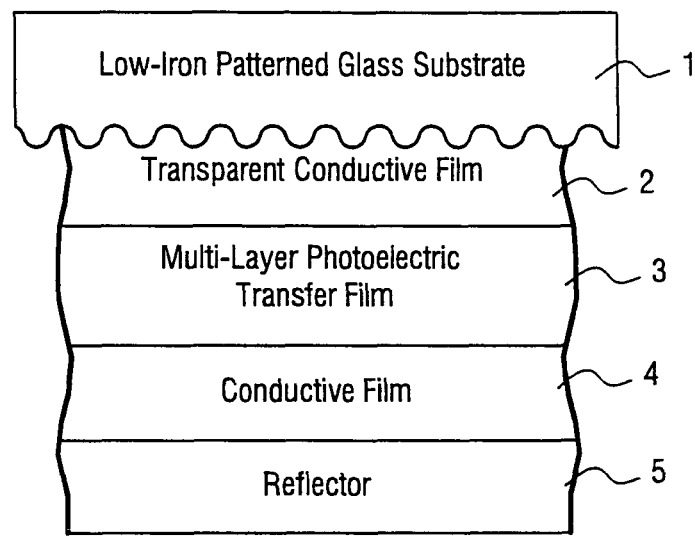

SOLAR CELL USING LOW IRON HIGH TRANSMISSION GLASS WITH ANTIMONY AND CORRESPONDING METHOD

This application is a divisional of application Ser. No. 11/122,218, filed May 5, 2005 now U.S. Pat. No. 7,700,870, the entire disclosure of which is hereby incorporated herein by reference in this application.

This invention relates to a high transmission low iron glass, including antimony, for use in solar cells or the like. A method is also provided. In certain example embodiments, the glass composition used for the glass is a low-iron type glass composition which includes antimony. The glass substrate used in a solar cell may be patterned in certain example embodiments of this invention.

BACKGROUND AND SUMMARY OF EXAMPLE EMBODIMENTS OF THE INVENTION

Solar cells are known in the art. A solar cell may include, for example, a photoelectric transfer film made up of one or more layers located between a pair of substrate. These layers may be supported by a glass substrate. Example solar cells are disclosed in U.S. Pat. Nos. 4,510,344, 4,806,436, 6,506,622, 5,977,477, and JP 07-122764, the disclosures of which are hereby incorporated herein by reference.

Substrate(s), sometimes called superstrate(s), in a solar cell are sometimes made of glass. Glass that is fairly clear in color and highly transmissive to visible light is sometimes desirable. Glass raw materials (e.g., silica sand, soda ash, dolomite, and/or limestone) typically include certain impurities such as iron, which is a colorant. The total amount of iron present is expressed herein in terms of $Fe_2O_3$ in accordance with standard practice. However, typically, not all iron is in the from of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

It has been found that the use of a low-iron highly transparent (optionally patterned) glass is advantageous for solar cell applications. The use of the low-iron composition in combination with the patterned surface(s) of the glass substrate(s) has been found to be advantageous with respect to optical properties, thereby leading to increased solar efficiency of a solar cell.

In certain example embodiments of this invention, a solar cell glass substrate has a visible transmission of at least 75% (more preferably at least 80%, even more preferably at least 85%, and most preferably at least about 90%). In making such a glass, a batch therefor includes a base glass (e.g., soda lime silica glass) and in addition comprises (or consists essentially of in certain other embodiments) a very small amount of total iron.

In the past some have tried to use cerium oxide in glass for solar cell applications as an oxidizer. However, it has been found that the use of significantly amounts of cerium oxide in solar cell glass can result in a loss of solar transmission after ultraviolet (UV) exposure, which is of course undesirable. Thus, in certain example embodiments of this invention, the use of cerium oxide is substantially avoided.

In this respect, it has surprisingly been found that the use of antimony (e.g., in the form of an oxide of antimony (Sb)) in high transmission low-iron glass for solar cells or the like results in a glass that need not suffer from the aforesaid problem associated with cerium oxide. Accordingly in certain example embodiments of this invention, antimony (Sb) is provided in low-iron high transmission glass. Thus, the resulting glass may include antimony (Sb) and be substantially free of cerium oxide so as to realize good stability of solar performance (e.g., no or reduced loss of total solar transmission after UV or sunlight exposure).

In certain example embodiments, the patterned glass substrate may have fairly clear color that may be slightly yellowish (a positive b* value is indicative of yellowish color). For example, in certain example embodiments, the patterned glass substrate may be characterized by a visible transmission of at least 90%, a total solar/energy value of at least 90%, a transmissive a* color value of from −1.0 to +1.0 (more preferably from −0.5 to +0.5, and most preferably from −0.2 to 0), and a transmissive b* color value of from 0 to +1.5 (more preferably from +0.1 to +1.0, and most preferably from +0.2 to +0.7). These properties may be realized at an example non-limiting reference glass thickness of from about 3-4 mm.

In certain example embodiments of this invention, in combination with the use of antimony (Sb), the glass has no more than 0.07% cerium oxide, more preferably no more than 0.06%, even more preferably no more than 0.04% cerium oxide, even more preferably no more than 0.02% cerium oxide, and possibly 0 or 0.01% cerium oxide.

In certain example embodiments of this invention, there is provided a solar cell comprising: a patterned glass substrate, wherein at least one surface of the patterned glass substrate has a surface roughness of from about 0.1 to 1.5 μm; first and second conductive layers with at least a photoelectric film provided therebetween; wherein the glass substrate is of a composition comprising:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.06% |
| cerium oxide | 0 to 0.07% |
| antimony oxide | 0.01 to 1.0% | wherein the glass substrate has visible transmission of at least 90%, a transmissive a* color value of −1.0 to +1.0 and a transmissive b* color value of from 0 to +1.5.

In other example embodiments of this invention, there is provided solar cell comprising: a glass substrate; a photoelectric film supported by at least the glass substrate; wherein the glass substrate is of a composition comprising:

| Ingredient | wt. % |
| --- | --- |
| total iron (expressed as $Fe_2O_3$) | 0.01 to 0.06% |
| antimony oxide | 0.01 to 0.5% | wherein the glass substrate has visible transmission of at least 90%, a transmissive a* color value of −1.0 to +1.0 and a positive transmissive b* color value.

In other example embodiments of this invention, there is provided a glass substrate comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.06% |
| cerium oxide | 0 to 0.07% |
| antimony oxide | 0.01 to 1.0% | wherein the glass substrate has visible transmission of at least 90%, a transmissive a* color value of −1.0 to +1.0 and a transmissive b* color value of from 0 to +1.5.

In still further example embodiments of this invention, there is provided a method of making patterned glass, the method comprising: providing a molten glass batch in a furnace or melter comprising from 67-75% $SiO_2$, from about 0.01 to 0.06% total iron, and antimony oxide; forwarding a glass ribbon from the furnace or melter to a nip between first and second rollers, at least one of the rollers having patter defined in a surface thereof, wherein the glass ribbon reaches the nip at a temperature of from about 1,900 to 2,400 degrees F.; at the nip, transferring the pattern from the roller(s) to the glass ribbon; the glass ribbon being at a temperature of from about 1,100 to 1,600 degrees F. upon exiting the nip; annealing the glass ribbon at least after the ribbon exits the nip, thereby providing a patterned glass having a visible transmission of at least 90%, from about 0.01 to 0.06% total iron, and from about 0.01 to 1.0% antimony oxide.

IN THE DRAWINGS

FIG. 1 is a cross sectional view of a solar cell according to an example embodiment of this invention.

DETAILED DESCRIPTION OF CERTAIN EXAMPLE EMBODIMENTS OF THIS INVENTION

An example solar cell is illustrated in cross section in FIG. 1. The solar cell includes, for example and without limitation, high transmission glass substrate 1, conductive film 2 which may be transparent, a photoelectric transfer film 3 which may include one or more layers, a rear surface electrode 4, and an optional reflector 5. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. The electrodes 2, 4 may be of a transparent conductor such as zinc oxide, or any other suitable material in certain example embodiments of this invention, and the reflector 5 may be of aluminum, silver or the like.

In certain example embodiments of this invention, one or both major surfaces (e.g., the interior surface only) of the glass substrate 1 may be patterned. Light tends to be refracted at interface(s) resulting from the patterning of the glass substrate 1, thereby causing light to proceed through the semiconductor layer(s) at an angle(s) such that the path is longer. As a result, more light can be absorbed by the solar cell and output current and/or efficiency can be improved/increased. In certain example embodiments of this invention, the patterned surface(s) of the glass substrate 1 may have a surface roughness (between peaks/valleys) of from about 0.1 to 1.5 μm, more preferably from about 0.5 to 1.5 μm. In certain example embodiments of this invention, the glass substrate 1 has one or more surfaces which are patterned so as to have a waviness feature defined therein. In the FIG. 1 embodiment, only one surface of the glass substrate 1 is patterned, although in other example embodiments both surfaces of the glass substrate may be patterned.

The optional patterning is preferably defined in the glass substrate 1 during the process of making the glass. An example technique for making such patterned glass is as follows. A furnace or melter is provided, as are first and second opposing rollers which define a nip therebetween. At least one of the rollers has a pattern defined in a surface thereof, where the pattern is made up of a plurality of peaks and valleys. A ribbon of glass exiting the furnace or melter is fed into the nip between the patterning rollers and reaches the nip at a temperature of from about 1,900 to 2,400 degrees F. At the nip, the pattern(s) from the roller(s) is transferred to the ribbon of glass, and then the patterned glass ribbon exits the nip at a temperature of from about 1,100 to 1,600 degrees F. After leaving the nip, the patterned glass ribbon is annealed, and may then be cut into a plurality of sheets. These glass sheets may or may not be heat treated (e.g., thermally tempered), and may be used in solar cell applications such as shown in FIG. 1. Example techniques for making the patterned glass substrate 1 are illustrated and described in U.S. Pat. Nos. 6,796,146 and/or 6,372,327 (except that different types of patterns are used), the disclosures of which are hereby incorporated herein by reference.

Certain glasses for patterned substrate 1 according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments of this invention, the resulting glass has visible transmission of at least 75%, more preferably at least 80%, even more preferably of at least 85%, and most preferably of at least about 90% (sometimes at least 91%) (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$): | 0.001-0.06% | 0.005-0.045% | 0.01-0.03% |
| % FeO: | 0-0.0040% | 0-0.0030% | 0.001-0.0025% |
| glass redox (FeO/total iron): | <=0.10 | <=0.06 | <=0.04 |
| cerium oxide: | 0-0.07% | 0-0.04% | 0-0.02% |
| antimony oxide: | 0.01-1.0% | 0.01-0.5% | 0.1-0.3% |
| $SO_3$: | 0.1-1.0% | 0.2-0.6% | 0.25-0.5% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also $Sb(Sb_2O_5)$. The use of the term antimony oxide herein means antimony in any possible oxidation state, and is not intended to be limiting to any particular stoichiometry.

In certain preferred embodiments, there is no cerium oxide in the glass. In particular, the presence of cerium oxide can have a detrimental effect on the transmission of the glass after exposure to UV and/or sunlight. This has been seen at 0.01 and 0.02% by weight. Thus, in certain example embodiments, the glass contains no cerium oxide. In certain embodiments, the resulting glass may contain from 0 to 0.01% by weight of cerium oxide.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantimonate (Sb ($Sb_2O_5$)), sodium or potassium nitrate and/or sodium sulfate. In certain example embodiments, the composition of the glass substrate 1 includes at least twice as much antimony oxide as total iron oxide, by weight, more preferably at least about three times as much, and most preferably at least about four times as much antimony oxide as total iron oxide.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

The use of antimony (e.g., in the form of antimony oxide) as an oxidizer in the glass batch acts as a decolorizer since during melting of the glass batch it causes iron in the ferrous state ($Fe^{2+}$; FeO) to oxidize to the ferric state ($Fe^{3+}$). This role of antimony as an oxidizer decreases the amount of ferrous state iron left in the resulting glass. The presence of antimony oxide in the glass batch causes an amount of the strong blue-green colorant of ferrous iron ($Fe^{2+}$; FeO) to oxidize into the weaker yellow-green ferric iron colorant ($Fe^{3+}$) during the glass melt (note: some ferrous state iron will usually remain in the resulting glass). The aforesaid oxidation of the iron tends to reduce coloration of the glass and also causes visible transmission to increase. Any yellowish color caused by oxidation of iron into ferric state ($Fe^{3+}$) iron (i.e., positive b*) is acceptable in solar cell applications and need not be compensated for by addition of other colorants thereby saving cost in certain example embodiments of this invention.

It will be appreciated by those skilled in the art that the addition of antimony oxide results in a glass with a lower "redox" value (i.e., less iron in the ferrous state FeO). In this regard, the proportion of the total iron in the ferrous state (FeO) is used to determine the redox state of the glass, and redox is expressed as the ratio $FeO/Fe_2O_3$, which is the weight percentage (%) of iron in the ferrous state (FeO) divided by the weight percentage (%) of total iron (expressed as $Fe_2O_3$) in the resulting glass. Due to at least the presence of the antimony oxide, the redox of glass according to certain example embodiments of this invention is very low as mentioned above, and the amount of iron in the ferrous state (FeO) will also be low as discussed above.

It is noted that glass according to certain example embodiments of this invention is often made via the known float process in which a tin bath is utilized. It will thus be appreciated by those skilled in the art that as a result of forming the glass on molten tin in certain exemplary embodiments, small amounts of tin or tin oxide may migrate into surface areas of the glass on the side that was in contact with the tin bath during manufacture (i.e., typically, float glass may have a tin oxide concentration of 0.05% or more (wt.) in the first few microns below the surface that was in contact with the tin bath).

In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | <=0.003% | <=0.0020% |
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

The aforesaid characteristics of the glass substrate 1 are for the glass substrate alone, not the overall solar cell or solar cell module.

As can be seen from Table 3 above, glasses for substrate 1 of certain embodiments of this invention achieve desired features of fairly clear color and/or high visible transmission, with slightly positive b* color in certain embodiments, while not requiring iron to be eliminated from the glass composition. This may be achieved through the provision of the unique material combinations described herein.

Examples 1-2

Example glasses for substrates 1 were made and tested according to example embodiments of this invention. Glasses of this invention may be made from batch ingredients using well known glass melting and refining techniques. The compositions of the glasses according to the examples are set forth below. All amounts of ingredients are in terms of weight percentage.

TABLE 4

EXAMPLES

| Compound | Ex. 1 | Ex. 2 |
|---|---|---|
| $SiO_2$: | 71.78 | 71.21 |
| $Na_2O$: | 13.59 | 13.71 |
| CaO: | 9.23 | 9.69 |
| MgO: | 4.07 | 4.06 |
| $Al_2O_3$: | 0.59 | 0.8 |
| $K_2O$: | 0.28 | 0.03 |
| $SO_3$: | 0.416 | 0.437 |
| $TiO_2$: | 0.012 | 0.012 |
| $Fe_2O_3$ (total iron): | 0.027 | 0.024 |
| Cerium oxide: | 0 | 0 |
| $Cr_2O_3$: | 0.0008 | 0.0008 |
| $Sb_2O_3$: | 0.2 | 0.2 |
| Glass Redox: | 0.04 | 0.025 |

Solar characteristics for the resulting Example glasses were as follows in the table below, with the below measurements taken after the melt and formation of the glass. It is noted that Lta (visible transmission %) was measured in accordance with Ill. D65, τe (total energy or total solar) was measured in accordance with ISO 9050 (incorporated herein by reference), and transmissive L*, a* and b* color coordinates (CIE) were measured using Ill. D65, 10 degree observer. All samples were from 3-4 mm thick.

Characteristics of Examples 1-2

TABLE 4

| Characteristic | Ex. 1 | Ex. 2 |
|---|---|---|
| % Lta | 91.48 | 91.65 |
| % τe | 91.35 | 91.53 |
| $Fe_2O_3$ (total iron %): | 0.027 | 0.024 |
| FeO (wt. %) | 0.0011 | 0.0006 |
| L* | 96.67 | 96.72 |
| a* | −0.08 | −0.04 |
| b* | +0.41 | +0.38 |
| Glass Redox: | 0.04 | 0.025 |

Once given the above disclosure many other features, modifications and improvements will become apparent to the skilled artisan. Such features, modifications and improvements are therefore considered to be a part of this invention, the scope of which is to be determined by the following claims:

What is claimed is:

1. A method of making patterned glass, the method comprising:
   providing a molten glass batch in a furnace or melter comprising from 67-75% $SiO_2$, from about 0.01 to 0.06% total iron, and antimony oxide;
   forwarding a glass ribbon from the furnace or melter to a nip between first and second rollers, at least one of the rollers having patter defined in a surface thereof, wherein the glass ribbon reaches the nip at a temperature of from about 1,900 to 2,400 degrees F.;
   at the nip, transferring the pattern from the roller(s) to the glass ribbon;
   the glass ribbon being at a temperature of from about 1,100 to 1,600 degrees F. upon exiting the nip;
   annealing the glass ribbon at least after the ribbon exits the nip, thereby providing a patterned glass having a visible transmission of at least 90%, from about 0.01 to 0.06% total iron, and from about 0.01 to 1.0% antimony oxide, wherein the patterned glass has a glass redox of <=0.10.

2. The method of claim 1, wherein the patterned glass has no more than 0.04% cerium oxide, a transmissive a* color value of −0.5 to +0.5 and a transmissive b* color value of from +0.1 to +1.0.

3. The method of claim 1, wherein the patterned glass has a transmissive a* color value of −1.0 to +1.0, and a transmissive b* color value of from 0 to +1.5.

4. The method of claim 1, wherein the patterned glass has a transmissive a* color value of −1.0 to +1.0.

* * * * *